US012707599B2

(12) United States Patent
Komchuad et al.

(10) Patent No.: US 12,707,599 B2
(45) Date of Patent: Aug. 11, 2026

(54) HEATSINK DEVICE

(71) Applicant: NXP B.V., Eindhoven (NL)

(72) Inventors: Yothin Komchuad, Klongluang (TH); Wichit Ruamwong, Don Mueang (TH); Crispulo Estira Lictao, Jr., Binan (PH)

(73) Assignee: NXP B.V., Eindhoven (NL)

( * ) Notice: Subject to any disclaimer, the term of this patent is extended or adjusted under 35 U.S.C. 154(b) by 99 days.

(21) Appl. No.: 18/646,324

(22) Filed: Apr. 25, 2024

(65) Prior Publication Data

US 2025/0338447 A1 Oct. 30, 2025

(51) Int. Cl.
*H05K 7/20* (2006.01)

(52) U.S. Cl.
CPC .................................. *H05K 7/2039* (2013.01)

(58) Field of Classification Search
CPC ....... H01L 2924/00; H01L 2924/00012; H01L 2924/00014; H01L 2924/181; H01L 2924/01033; H01L 2924/01082; H01L 2924/207; H05K 1/0204
See application file for complete search history.

(56) References Cited

U.S. PATENT DOCUMENTS 5,311,060 A * 5/1994 Rostoker ................ H05K 3/303 257/667
5,723,899 A * 3/1998 Shin ........................ H01L 24/49 257/667
6,677,833 B2 * 1/2004 Sheen ...................... H03H 7/46 333/132
6,774,718 B2 * 8/2004 Ichitsubo ................ H01L 23/66 330/129
6,847,262 B2 * 1/2005 Ichitsubo ................ H01L 23/66 330/307
6,914,482 B2 * 7/2005 Ichitsubo ............. H03G 3/3042 330/129
7,368,810 B2 5/2008 Seng et al.
7,477,108 B2 * 1/2009 Ichitsubo ................ H03F 3/602 330/307
7,851,897 B1 12/2010 Cate et al.
8,058,104 B2 * 11/2011 Islam .................. H01L 23/3128 438/123
8,193,620 B2 6/2012 Alberghini et al.
8,786,165 B2 7/2014 Hase
9,484,289 B2 * 11/2016 Ge ...................... H01L 23/4334
9,704,725 B1 * 7/2017 Kim .................... H01L 21/4842
(Continued)

FOREIGN PATENT DOCUMENTS

CN 101587869 B 4/2011

OTHER PUBLICATIONS

Pcbbuy; "QFN package"; Retrieved from internet https://www.pcbbuy.com/news/What-is-QFN-package.html on Apr. 15, 2024; Aug. 14, 2021; 3 pages.

*Primary Examiner* — Nelson J Nieves

(57) ABSTRACT

One example discloses a heatsink device, including: a lead-frame having a die-pad, a first edge, a second edge, a third edge, and a fourth edge; wherein the lead-frame also includes a set of heatsinks, including, a first heatsink located where the first edge and the fourth edge of the lead-frame intersect; a second heatsink located where the first edge and the second edge of the lead-frame intersect; and a third heatsink located where the second edge and the third edge of the lead-frame intersect.

21 Claims, 5 Drawing Sheets

(56) References Cited

U.S. PATENT DOCUMENTS

| | | | | |
|---|---|---|---|---|
| 9,953,904 | B1 * | 4/2018 | Oratti Kalandar | H01L 23/3114 |
| 12,283,555 | B2 * | 4/2025 | Bayrakci | H01L 24/37 |
| 2004/0232982 | A1 * | 11/2004 | Ichitsubo | H01L 24/49 330/129 |
| 2013/0264610 | A1 * | 10/2013 | Chen | H01L 23/345 257/467 |
| 2014/0016270 | A1 * | 1/2014 | Bonkohara | H01L 23/34 361/699 |
| 2014/0239476 | A1 * | 8/2014 | Ge | H01L 23/34 438/122 |
| 2015/0108625 | A1 * | 4/2015 | Ge | H01L 23/36 438/122 |
| 2017/0018487 | A1 | 1/2017 | Wang et al. | |
| 2020/0273790 | A1 * | 8/2020 | Tay | H01L 23/49861 |
| 2021/0118778 | A1 | 4/2021 | Blansaer | |
| 2021/0313243 | A1 * | 10/2021 | McPherson | H01L 23/49541 |
| 2022/0311392 | A1 * | 9/2022 | Saint-Erne | H03F 1/0288 |
| 2022/0384315 | A1 * | 12/2022 | Lynch | H01L 23/49861 |
| 2025/0105104 | A1 * | 3/2025 | Jiang | H01L 23/49503 |
| 2025/0246521 | A1 * | 7/2025 | Liu | H01L 23/3121 |
| 2025/0273481 | A1 * | 8/2025 | Catalano | H01L 23/49562 |

* cited by examiner

HEATSINK DEVICE

The present specification relates to systems, methods, apparatuses, devices, articles of manufacture and instructions for creating a heatsink device.

SUMMARY

According to an example embodiment, a heatsink device, comprising: a lead-frame having a die-pad, a first edge, a second edge, a third edge, and a fourth edge; wherein the lead-frame also includes a set of heatsinks, including, a first heatsink located where the first edge and the fourth edge of the lead-frame intersect; a second heatsink located where the first edge and the second edge of the lead-frame intersect; and a third heatsink located where the second edge and the third edge of the lead-frame intersect.

In another example embodiment, the lead-frame further includes a fourth heatsink located where the third edge and the fourth edge of the lead-frame intersect.

In another example embodiment, the set of heatsinks and the die-pad are a part of the lead-frame and are differentiated only based on their different thicknesses.

In another example embodiment, the lead-frame under the die-pad has a first thickness; and the set of tie-bars and heatsinks has a second thickness, that is greater than the first thickness.

In another example embodiment, the first thickness is an etched thickness, and the second thickness is a non-etched thickness.

In another example embodiment, the heatsinks are separate from each other.

In another example embodiment, each of the heatsinks are coupled to the die-pad by a separate tie-bar, one tie-bar for each heatsink.

In another example embodiment, the heatsinks are located at corners of the lead-frame.

In another example embodiment, the lead-frame includes a first insulator that separates the first heatsink from the second heatsink along the first edge; and the lead-frame includes a second insulator that separates the second heatsink from the third heatsink along the second edge.

In another example embodiment, the lead-frame further includes a fourth heatsink located where the third edge and the fourth edge of the lead-frame intersect; the lead-frame includes a third insulator that separates the third heatsink from the fourth heatsink along the third edge; and the lead-frame includes a fourth insulator that separates the fourth heatsink from the first heatsink along the fourth edge.

In another example embodiment, the lead-frame further includes a fourth heatsink located where the third edge and the fourth edge of the lead-frame intersect; the lead-frame includes a first set of lead-pads that separate the first heatsink from the second heatsink along the first edge; and the lead-frame includes a second set of lead-pads that separate the second heatsink from the third heatsink along the second edge.

In another example embodiment, the lead-frame includes a first insulator that separates the second heatsink from the third heatsink along the second edge; and the lead-frame includes a second insulator that separates the first heatsink from the fourth heatsink along the fourth edge.

In another example embodiment, the lead-frame includes a third set of lead-pads that separate the third heatsink from the fourth heatsink along the third edge; and the lead-frame includes a fourth set of lead-pads that separate the fourth heatsink from the first heatsink along the fourth edge.

In another example embodiment, the die-pad is configured to be coupled to a chip-die; the first and second sets of lead-pads are configured to be coupled to the chip-die with a set of wire bonds; and at least one of the heatsinks is coupled to the die-pad with a tie-bar.

In another example embodiment, wherein the die-pad is configured to be coupled to a chip-die; further comprising, a set of wire bonds configured to be coupled to the chip-die; wherein the set of wire bonds are only coupled between the first and second sets of lead-pads and the chip-die; and wherein the heatsinks are only coupled to the die-pad with the tie-bar.

In another example embodiment, the heatsink device is configured to be embedded in an encapsulated package.

In another example embodiment, the first set of lead-pads, the second set of lead-pads, and each of the heatsinks includes a set of exposed surfaces configured to protrude out from the encapsulated package.

In another example embodiment, the set of exposed surfaces from the first and second sets of leads are configured only to be galvanically coupled to an external circuit.

In another example embodiment, the set of exposed surfaces from the heatsinks are configured only to be thermally coupled to an external heatsink.

In another example embodiment, the set of exposed surfaces from each of the heatsinks are configured to protrude out from at least a top surface, a bottom surface, and two side surfaces of the encapsulated package.

In another example embodiment, the encapsulated heatsink device is a Quad Flat No-Lead (QFN) package.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
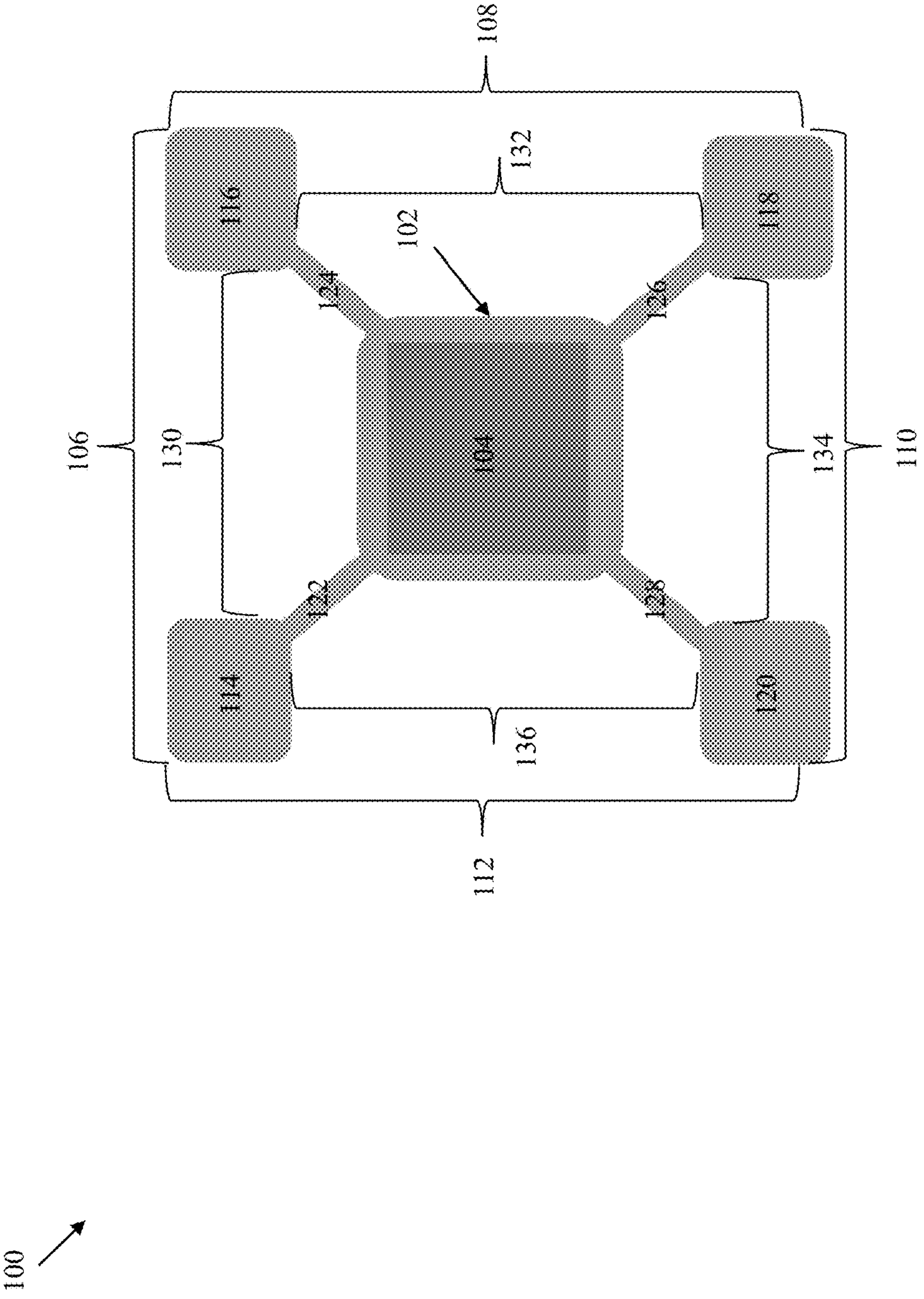
FIG. 1 represents a first example of a heatsink device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Heat management in semiconductor applications has been an ongoing concern for some time. This is in part because heat management becomes increasingly more important as every new generation of semiconductor materials, semiconductor feature sizes, die-chip size, package technology, and/or power demands change.

Now discussed are example embodiments of a new heatsink device that will address some or all of these concerns, at least for now.

FIG. 1 represents a first example 100 of a heatsink device. The first example 100 heatsink device includes a lead-frame. The lead-frame includes a die-pad 102 upon which a chip-die 104 can be mounted. The lead-frame has a first edge 106, a second edge 108, a third edge 110, and a fourth edge 112. In this example embodiments, the lead-frame includes four heatsinks shown as a first heatsink 114, a second heatsink 116, a third heatsink 118, and a fourth heatsink 120; however, a greater or lesser number of heatsinks are possible in other example embodiments.

In some but not all example embodiments, a set of tie-bars are coupled to some or all of the set of heatsinks. In this example embodiment, a first tie-bar 122 is coupled between the die-pad 102 and the first heatsink 114. A second tie-bar 124 is coupled between the die-pad 102 and the second heatsink 116. A third tie-bar 126 is coupled between the die-pad 102 and the third heatsink 118. And, a fourth tie-bar 128 is coupled between the die-pad 102 and the fourth heatsink 120.

In this example embodiment, separating each of the heatsinks 114, 116, 118, 120 are a set of four insulators (e.g. non-conductive regions such as by air or an encapsulant). The first insulator 130 separates the first heatsink 114 from the second heatsink 116. The second insulator 132 separates the second heatsink 116 from the third heatsink 118. The third insulator 134 separates the third heatsink 118 from the fourth heatsink 120. And, the fourth insulator 136 separates the fourth heatsink 120 from the first heatsink 114.

In the first example 100 heatsink device heat generated by an active/operational chip-die 104 is conducted through the die-pad 102 and the tie-bars 122, 124, 126, 128 to the heatsinks 114, 116, 118, 120. In some example embodiments the heatsinks 114, 116, 118, 120 are coupled to another heatsink (e.g. a PC board, a cold-plate, etc.) to further enhance heat conduction away from the chip-die 102.

In still other example embodiments the heatsinks 114, 116, 118, 120 can be coupled to liquid nitrogen or other coolant to super-cool the chip-die 104 or another structure or electrical circuit supporting perhaps a quantum computational device that needs to operate at very low temperatures.

Figure 2:
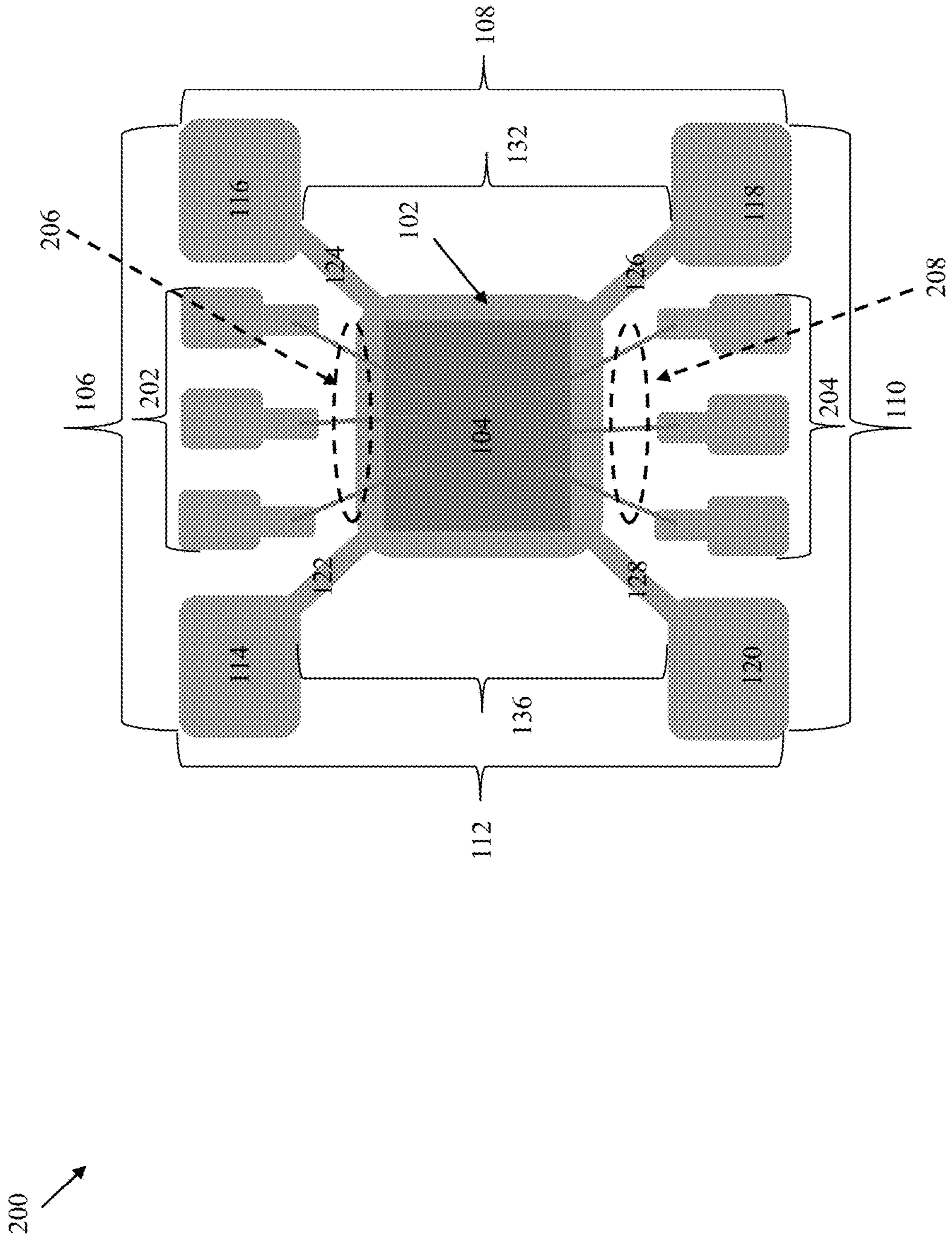
FIG. 2 represents a second example of the heatsink device.

FIG. 2 represents a second example 200 of the heatsink device. The second example 200 heatsink device includes many of the elements from the first example 100 heatsink device as shown by the reference numbers in FIG. 1.

However, in the second example 200 heatsink device, a first set of lead-pads 202 separates the first heatsink 114 from the second heatsink 116, and a second set of lead-pads 204 separates the third heatsink 118 from the fourth heatsink 120.

The first set of lead-pads 202 is coupled to the chip-die 104 with a first set of bond wires 206, and the second set of lead-pads 204 is coupled to the chip-die 104 with a second set of bond wires 208.

Figure 3:
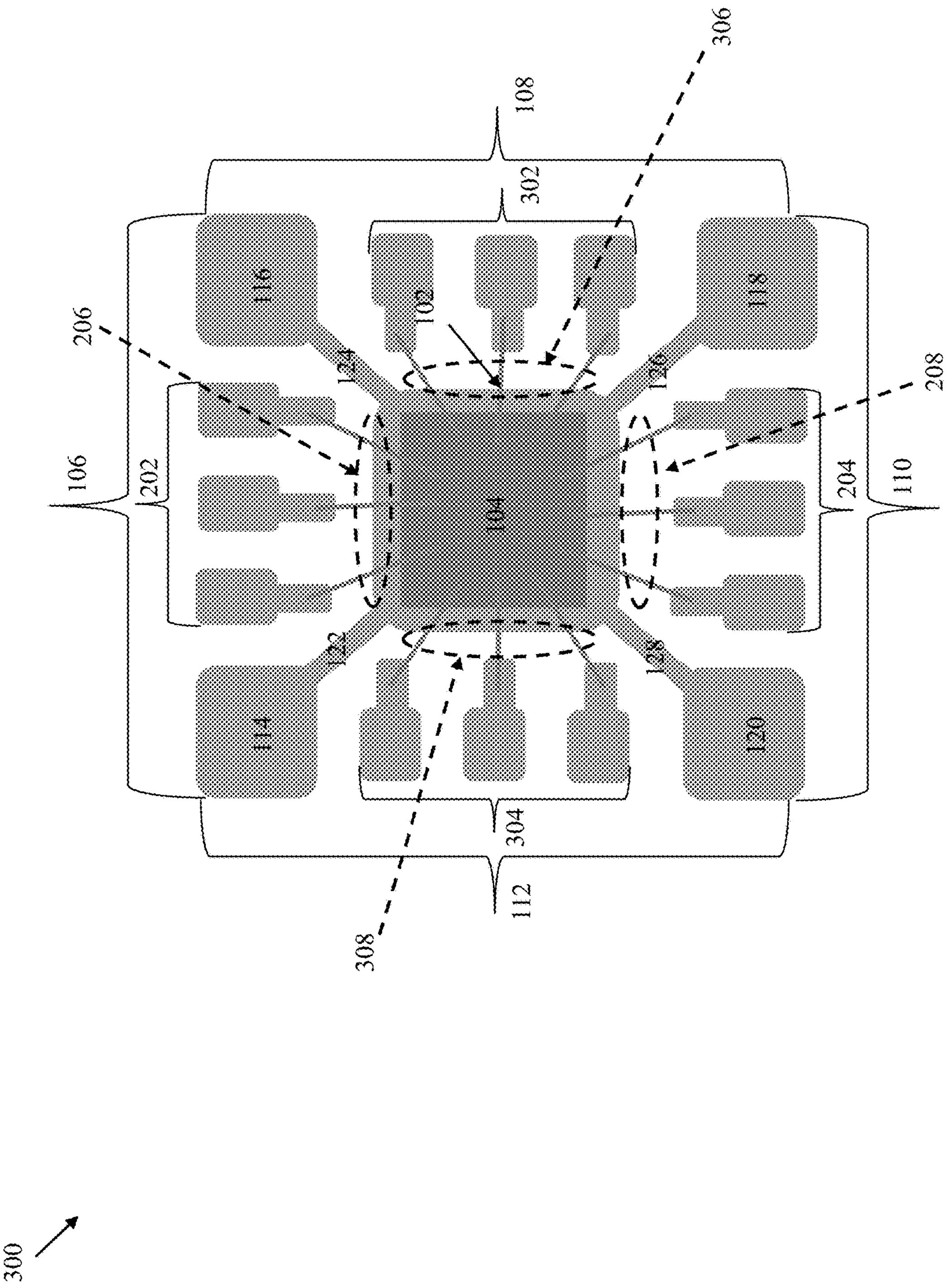
FIG. 3 represents a third example of the heatsink device.

FIG. 3 represents a third example 300 of the heatsink device. The third example 300 heatsink device includes many of the elements from the first example 100 heatsink device as well as the first set of lead-pads 202 and the second set of lead-pads 204 as shown by the reference numbers in FIG. 2.

However, in the third example 300 heatsink device, a third set of lead-pads 302 separates the second heatsink 116 from the third heatsink 118, and a fourth set of lead-pads 304 separates the fourth heatsink 120 from the first heatsink 114.

The third set of lead-pads 302 is coupled to the chip-die 104 with a third set of bond wires 306, and the fourth set of lead-pads 304 is coupled to the chip-die 104 with a fourth set of bond wires 308.

In some example embodiments the third example 300 heatsink device is embedded in a quad flat no-lead (QFN) package.

Figure 4B:
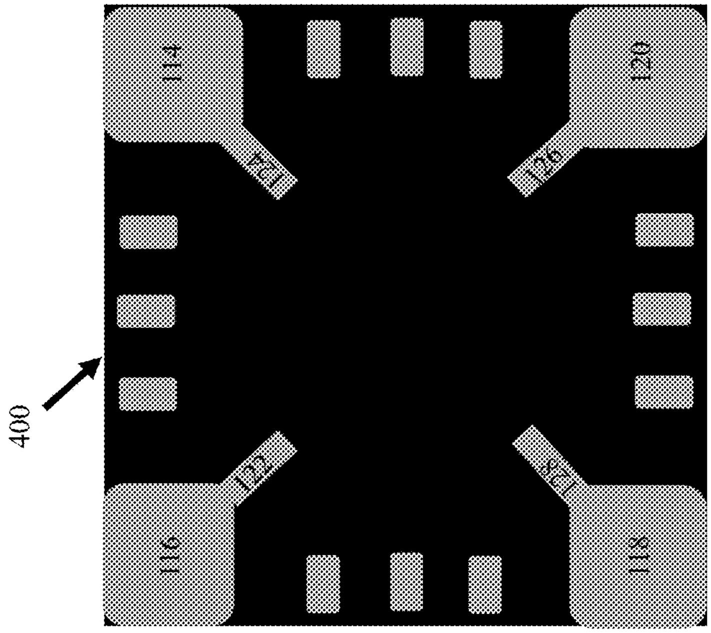
FIG. 4B represents an example bottom view of the heatsink device embedded in an encapsulated package.
Figure 4A:
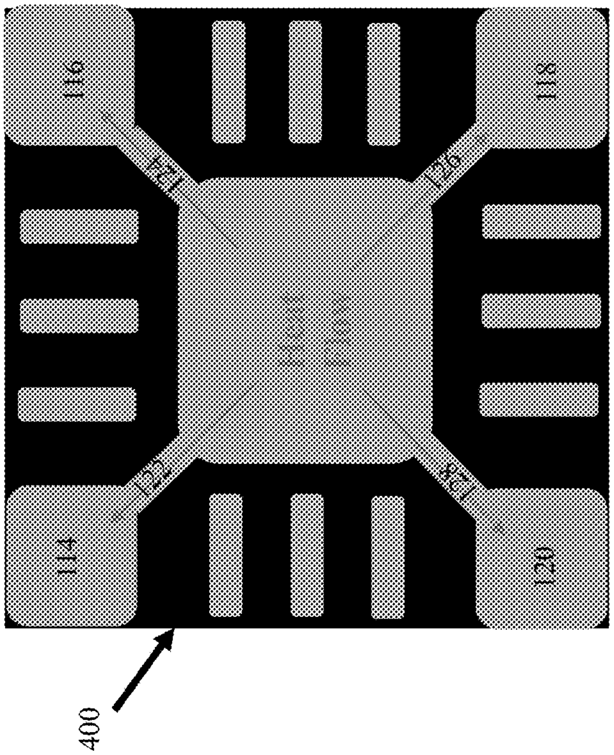
FIG. 4A represents an example top view of the heatsink device embedded in an encapsulated package.
Figure 4C:
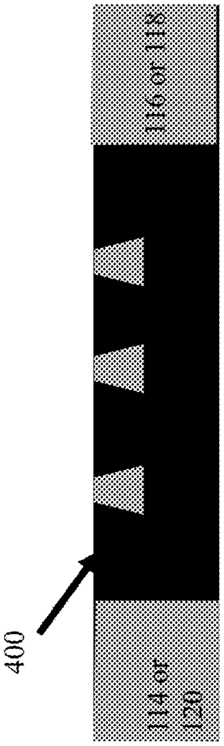
FIG. 4C represents an example side view of the heatsink device embedded in an encapsulated package.

FIGS. 4A, 4B, 4C represent example views of the heatsink device embedded in an encapsulant. FIG. 4A is a top view, FIG. 4B is a bottom view, and FIG. 4C is a side view of the third example 300 heatsink device embedded in an encapsulant 400.

In this example embodiment, the heatsinks 114, 116, 118, 120 are at each corner of this chip package and also extend from the top surface to the bottom surface of the chip package. Thus each individual heatsink is exposed to air or another heatsink device on four sides as shown.

The increased thickness and layout of the die flag improves thermal dissipation of the QFN by allowing heat transfer through 6 sides of the package.

Figure 5:
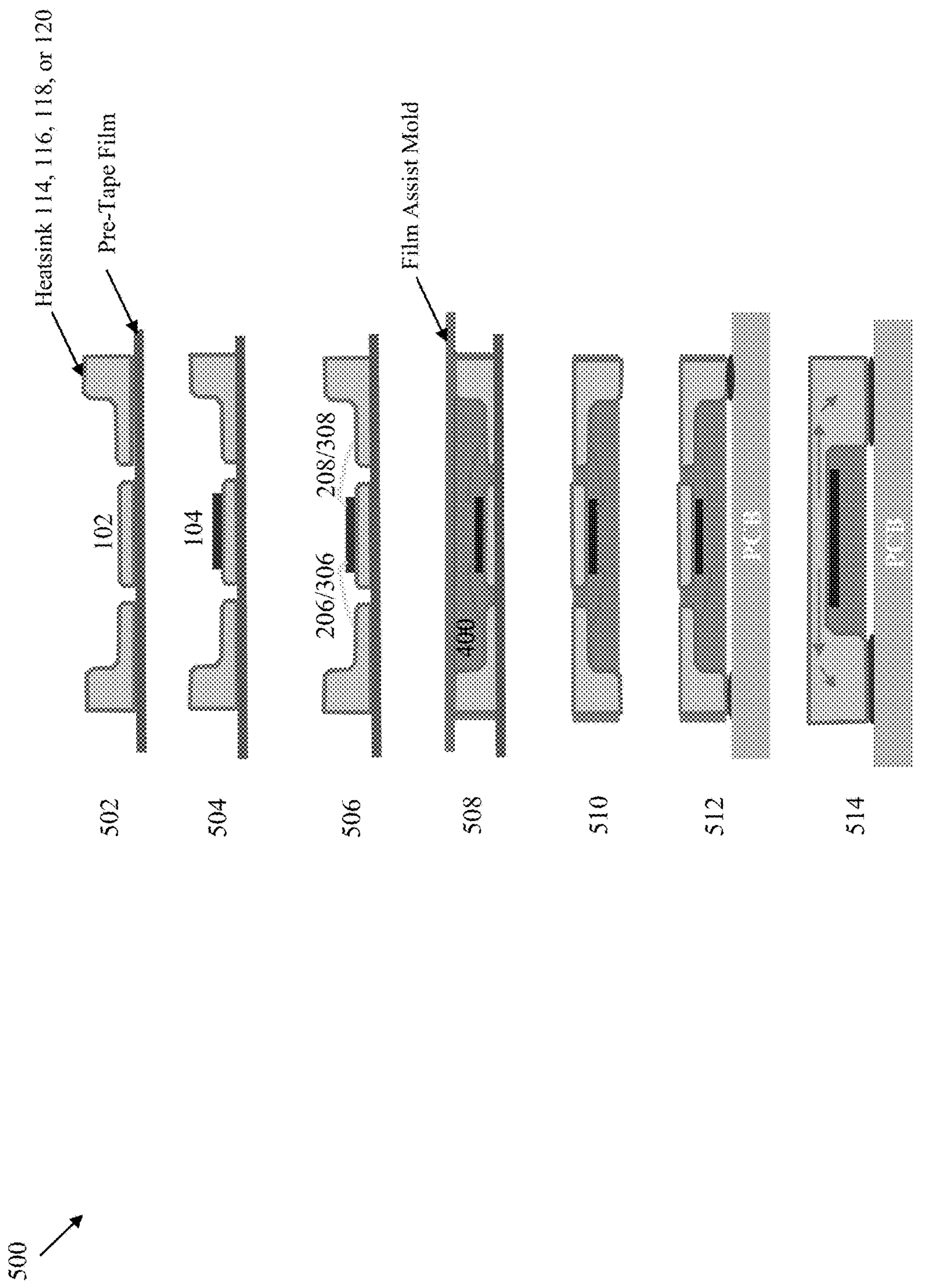
FIG. 5 represents an example set of steps for mounting a chip-die on the heatsink device, encapsulating the heatsink device, and mounting the encapsulated heatsink device on a PC board.

FIG. 5 represents an example set of steps 600 for mounting a chip-die 104 on the heatsink device 100, 200, or 300, encapsulating 400 the heatsink device, and mounting the encapsulated heatsink device on a PC board (PCB).

In step 502, a lead-frame is fabricated, including full thickness portions (e.g. 300 μm) that become the heatsinks 114, 116, 118, 120, 122, 124, 126, and 128 and etched portions (125 μm) for at least the die-pad 102 and lead-pads 202, 204, 302, 304. and perhaps some or all of the tie-bars. A pre-tape film is attached to the lead-frame as shown.

In step 504, the chip-die 104 (50 μm) is attached to the die-pad 102.

In step 506, sets of bond wires (e.g. 206, 208, 306, and/or 308) having a loop height (50 μm) electrically couple the chip-die 104 to the sets of lead-pads (e.g. 202, 204, 302, and/or 304).

In step 508, the encapsulant 400 (e.g. molding compound) is added and formed with help of a film assist. Mold cap=300 μm and wire to mold surface gap=60 μm.

In step 510, the singulation/dicing is performed, leads are pulled back, various films are removed, laser markings are added, and the chip package is inverted.

In step 512, the chip package is mounted on a printed circuit board (PCB), or other external heatsink (not shown).

In step 514, during operation heat (see arrows) is conducted from the chip-die 104 to the heatsinks 114, 116, 118, and 120 for thermal dissipation.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A heatsink device, comprising:

a lead-frame having a die-pad, a first edge, a second edge, a third edge, and a fourth edge;

wherein the lead-frame further includes a set of heatsinks, including, a first heatsink located where the first edge and the fourth edge of the lead-frame intersect;

a second heatsink located where the first edge and the second edge of the lead-frame intersect; and a third heatsink located where the second edge and the third edge of the lead-frame intersect, wherein the heatsink device is configured to be embedded in an encapsulated package such that each of the first heatsink, the second heatsink, and the third heatsink is exposed on at least a top surface of the encapsulated package and a bottom surface of the encapsulated package.

2. The heatsink device of claim 1:

wherein the lead-frame further includes a fourth heatsink located where the third edge and the fourth edge of the lead-frame intersect.

3. The heatsink device of claim 1:

wherein the set of heatsinks and the die-pad are part of the lead-frame and have differing thicknesses.

4. The heatsink device of claim 1:

wherein the lead-frame under the die-pad has a first thickness that is an etched thickness; and wherein the set of heatsinks has a second thickness that is greater than the first thickness.

5. The heatsink device of claim 4:

wherein the second thickness is a non-etched thickness.

6. The heatsink device of claim 1:

wherein the heatsinks are separate from each other.

7. The heatsink device of claim 1:

wherein each of the heatsinks is coupled to the die-pad by a separate tie-bar.

8. The heatsink device of claim 1:

wherein the heatsinks are located at corners of the lead-frame.

9. The heatsink device of claim 1:

wherein the lead-frame includes a first insulator that separates the first heatsink from the second heatsink along the first edge; and wherein the lead-frame includes a second insulator that separates the second heatsink from the third heatsink along the second edge.

10. The heatsink device of claim 9:

wherein the lead-frame further includes a fourth heatsink located where the third edge and the fourth edge of the lead-frame intersect;

wherein the lead-frame includes a third insulator that separates the third heatsink from the fourth heatsink along the third edge; and wherein the lead-frame includes a fourth insulator that separates the fourth heatsink from the first heatsink along the fourth edge.

11. The heatsink device of claim 1:

wherein the lead-frame further includes a fourth heatsink located where the third edge and the fourth edge of the lead-frame intersect;

wherein the lead-frame includes a first set of lead-pads that separate the first heatsink from the second heatsink along the first edge; and wherein the lead-frame includes a second set of lead-pads that separate the second heatsink from the third heatsink along the second edge.

12. The heatsink device of claim 11:

wherein the lead-frame includes a first insulator that separates the second heatsink from the third heatsink along the second edge; and wherein the lead-frame includes a second insulator that separates the first heatsink from the fourth heatsink along the fourth edge.

13. The heatsink device of claim 11:

wherein the lead-frame includes a third set of lead-pads that separate the third heatsink from the fourth heatsink along the third edge; and wherein the lead-frame includes a fourth set of lead-pads that separate the fourth heatsink from the first heatsink along the fourth edge.

14. The heatsink device of claim 11:

wherein the die-pad is configured to be coupled to a chip-die;

wherein the first and second sets of lead-pads are configured to be coupled to the chip-die with a set of wire bonds; and wherein at least one of the heatsinks is coupled to the die-pad with a tie-bar.

15. The heatsink device of claim 11, further comprising:

a chip-die coupled to the die-pad;

a set of wire bonds coupling the chip-die to the first set of lead-pads and the second set of lead-pads; and at least one tie-bar coupling at least one heatsink of the set of heatsinks to the die-pad.

16. The heatsink device of claim 1, wherein each of the first heatsink, the second heatsink, and the third heatsink is further exposed on two sides of the encapsulated package.

17. The heatsink device of claim 11:

wherein each of the first set of lead-pads and the second set of lead-pads includes a set of exposed surfaces configured to protrude out from the encapsulated package.

18. The heatsink device of claim 17:

wherein the set of exposed surfaces of the first set of lead-pads and the set of exposed surfaces of the second set of lead-pads are configured to be galvanically coupled to an external circuit.

19. The heatsink device of claim 16, wherein the first heatsink, the second heatsink, and the third heatsink are configured to be thermally coupled, via an exposed surface, to an external heatsink.

20. The heatsink device of claim 19, wherein the external heatsink comprises a coolant.

21. The heatsink device of claim 16:

wherein the encapsulated package is a Quad Flat No-Lead (QFN) package.

* * * * *